United States Patent
Muendel et al.

(10) Patent No.: US 7,366,210 B2
(45) Date of Patent: Apr. 29, 2008

(54) SINGLE SPATIAL MODE OUTPUT MULTI-MODE INTERFERENCE LASER DIODE WITH EXTERNAL CAVITY

(75) Inventors: Martin H. Muendel, Oakland, CA (US); Victor Rossin, Mountain View, CA (US); Bruno Acklin, Mountain View, CA (US)

(73) Assignee: JDS Uniphase Corporation, Milpitas, CA (US)

(*) Notice: Subject to any disclaimer, the term of this patent is extended or adjusted under 35 U.S.C. 154(b) by 0 days.

(21) Appl. No.: 11/560,047

(22) Filed: Nov. 15, 2006

(65) Prior Publication Data

US 2007/0153859 A1  Jul. 5, 2007

Related U.S. Application Data

(60) Provisional application No. 60/737,925, filed on Nov. 18, 2005.

(51) Int. Cl.
*H01S 3/098* (2006.01)
*H01S 5/00* (2006.01)

(52) U.S. Cl. .................................... 372/18; 372/50.1
(58) Field of Classification Search ............ 372/18, 372/29.021, 50.1, 73, 81
See application file for complete search history.

(56) References Cited

U.S. PATENT DOCUMENTS

| | | | |
|---|---|---|---|
| 6,580,850 B1 | 6/2003 | Kazarinov et al. | 385/28 |
| 6,768,758 B1 | 7/2004 | Hamamoto | 375/50.22 |
| 6,944,192 B2 | 9/2005 | Prassas et al. | 372/6 |
| 2002/0097765 A1* | 7/2002 | Marsh et al. | 372/50 |

OTHER PUBLICATIONS

Broeke et al, "Monolithical integration of semiconductor optical amplifiers and passive mode-filters fro low facet reflectivity", 2001 IEEE/LEOS Symposium Benelux Chapter. Dec. 3, 2001.
S. D. DeMars, A. Schoenfelder, V. Wong, and R. J. Lang, "Optical Properties of Angled-Grating Distributed Feedback Lasers," IEEE 16th ISLC Conference Digest, 1998, pp. 57-58.
V. N. Gulgazov, H. Zhao, D. Nam, J. S. Major, and T. L. Koch "Tunable high power AlGaAs distributed Bragg reflector Laser diodes", Electron. Lett., 1997, 33, (1), pp. 58-59.

(Continued)

*Primary Examiner*—Armando Rodriguez
(74) *Attorney, Agent, or Firm*—Allen, Dyer, Doppelt, Milbrath & Gilchrist, P.A.

(57) ABSTRACT

The invention relates to a conventional broad-area laser having a single-mode output through the phenomenon of multimode interference (MMI) in step-index waveguides. Another aspect of the present invention relates to a very robust multi-mode compound cavity laser design that is fully defined by the geometry and the refractive index profile of the MMI region, which is quite insensitive to slight macro-scale refractive index variations due to manufacturing variation or temperature. As the self-imaging position shifts linearly in the refractive index, the confocal beam parameter can be made relatively long.

17 Claims, 2 Drawing Sheets

OTHER PUBLICATIONS

J. S. Major, S. O'Brien, V. Gulgazov, D. F. Welch, and R. J. Lang "High Power single-mode AlGaAs DBR laser diodes operating at 856 nm", Electron. Lett., 1994, 30, (6), pp. 496-497.

V. Rossin, E. Zucker, M. Peters, M. Everett, B. Acklin, "High-power high-efficiency 910-980nm broad area laser diodes", Proceedings of SPIE, High Power Diodes Laser Technology and Applications II, 2004, 5336, pp. 196-202.

L.B. Soldano and E.C.M. Pennings, J. Lightwave Tech., "Optical multi-mode interference devices based on self-imaging: principles and applications", vol. 13, pp. 615-627, Apr. 1995.

D. Mehuys, L. Goldberg, D.F. Welch, "5.25W cw near-diffraction-limited tapered-stripe semicondcuctor optical amplifier", IEEE Photon. Technol. Lett., 1993, 5(10), pp. 1179-1182.

S. O'Brien, R. Lang, R. Parke, J. Major, D. F. Welch, D. Mehuys, "2.2-W continuous-wave diffraction-limited integrated master oscillator power amplifier at 854nm", IEEE Photon. Technol. Lett., 1997, 9 (4), pp. 440-442.

Sellin et al, "High-power ultra-fast single- and multi-mode quantum dot lasers with superior beam profile" SPIE 5365, May 2004, pp. 46-59.

* cited by examiner

SINGLE SPATIAL MODE OUTPUT MULTI-MODE INTERFERENCE LASER DIODE WITH EXTERNAL CAVITY

CROSS-REFERENCE TO RELATED APPLICATIONS

This application claims priority of U.S. Provisional Application No. 60/737,925 filed Nov. 18, 2005, entitled "WAVELENGTH STABILIZED LASER DIODE" which is incorporated herein by reference for all purposes.

TECHNICAL FIELD

The present invention relates to a laser with an integrated semiconductor and silica optical cavity comprising a multi-mode interference waveguide for generating high power, high efficiency single spatial mode optical output.

BACKGROUND OF THE INVENTION

High-power semiconductor laser diodes are often designed with a wide electrically pumped cavity, which supports several lateral spatial modes. Such cavities or waveguides are termed multi-mode. Because the waveguide width is larger than the width of a single mode fiber or slab waveguide, coupling the laser output efficiently into a single mode waveguide presents a basic problem.

Many prior art methods of extracting high single-mode power out of inherently multimode structures, such as passive coherent combination, rely on self-organizing nonlinear behaviors of coupled oscillators, for example.

While U.S. Pat. No. 6,944,192 in the name of Prassas assigned to Corning Incorporated and U.S. Pat. No. 6,580,850 in the name of Kazarinov assigned to Applied WDM Inc. show devices which appear to be similar, they both use the principle of adiabatic transformation of the beam profile from the laser. An adiabatic transformation produces a single mode output by utilizing only one mode of the laser while stripping all the other lasing modes, if any. Such a process of forcing a multimode laser to run in a single mode is typically very inefficient and difficult to achieve.

However the underlying physics of the laser device disclosed in instant application is different from those in the abovementioned patents, being based on the principle of imaging in a multi-mode interference (MMI) waveguide, whereby a beam profile at a given plane is reproduced periodically over an imaging distance as an optical wave propagates along the waveguide. Here, the cavity roundtrip length is chosen to match this imaging distance or a multiple thereof, while a single-mode waveguide provides a feedback source as well as a port for the optical output. A key characteristic is that the self-imaging distance is a simple function of the waveguide width, refractive index, and wavelength. This consideration does not arise in the prior art.

As a result, throughout the entire cavity except at the output, the beam is multimode and practically fills the entire waveguide. When it reaches the output plane, it collapses to a single-mode spot that is matched to the single-mode output waveguide. All of the modes are theoretically combining perfectly into a single mode at the output of the MMI waveguide. Also, the disclosed device design differs from prior art in that there is no need for a gradual tapered section—the transition from the multimode section to the single-mode waveguide can be abrupt.

Perhaps the prior art most relevant to instant disclosure is U.S. Pat. No. 6,768,758 in the name of Hamamoto assigned to NEC Incorporated. It utilizes a monolithic structure that is based on the MMI principle, starting with a single-mode beam, allowing laser gain to occur in a multimode beam, and then it subsequently reproducing a single mode beam. As the entire MMI is made of semiconductor, catastrophic optical damage (COD) at the single mode hot spot on the output facet is expected to limit the achievable output power. It therefore seems unlikely that this structure offers any significant benefit over current state of the art single mode lasers operating at the one watt level or below.

In contrast, instant application avoids creating a single mode "hot spot" on the facet of the semiconductor laser chip which is more sensitive to degradation in regions of high optical power density. The laser waveguide and the silica waveguide (coupled in close proximity) together constitute a MMI structure, so that the beam is multimode at their interface, in particular, the laser facet. The beam becomes single mode only inside the silica waveguide, which is better able to handle a high optical power density. As a result, the device is enabled to produce high-power single mode output power that should be comparable to what is achieved in multimode broad-area diodes, namely in the range of 5-10 watt or more. For example, at JDSU Inc. an optical power output of 14 W per device and over 70% electrical-to-optical conversion has been demonstrated in a broad-area diode.

Thus, an object of the present invention is to increase the stability and the output power of a conventional broad-area laser by lowering the peak power density within the semiconductor gain region. Broad-area lasers have not only much higher power but also higher inherent efficiency than traditional single-mode lasers and tapered oscillators since the lasing volume is more uniformly filled.

A further object of the present invention is to improve the manufacturability of a conventional broad-area laser through a robust multi-mode compound laser cavity design that is fully defined by the geometry and the refractive index profile of the MMI region, which is quite insensitive to slight macro-scale refractive index variations due to manufacturing variation or temperature. As the self-imaging position shifts linearly in the refractive index, the confocal beam parameter can be made relatively long.

Another object of the present invention is to use a geometry that can be engineered explicitly to avoid optical hot spots on the laser facet and inside the semiconductor laser chip.

Still a further object of the present invention is to leverage existing investment and expertise in broad-area laser technology.

SUMMARY OF THE INVENTION

Accordingly, the present invention relates to a conventional broad-area laser having a single-mode output through the phenomenon of multimode interference (MMI) in step-index waveguides.

Another aspect of the present invention relates to a robust multi-mode compound cavity laser design that is fully defined by the geometry and the refractive index profile of the MMI region, which is quite insensitive to slight macro-scale refractive index variations due to manufacturing variation or temperature. As the self-imaging position shifts linearly in the refractive index, the confocal beam parameter can be made relatively long.

The present invention relates to a high power laser comprising:

a planar multi-mode optical gain region on a semiconductor chip extending between a first low-reflectivity facet and a back-reflecting facet;

a means for electrically pumping the multi-mode optical gain region to provide optical gain;

a planar passive multi-mode interference region on an optical chip extending between a second low-reflectivity facet and an output end which is coupled to a single-mode waveguide for providing an output for the laser; and an optical reflector optically coupled with the single-mode waveguide, whereby a laser cavity is defined by the optical reflector and the back-reflecting facet;

wherein the first and second low-reflectivity facets are optically coupled to form a compound multimode interference region between the back-reflecting facet and the output end of the planar passive multi-mode interference region with a length that is a multiple of a self-imaging distance.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
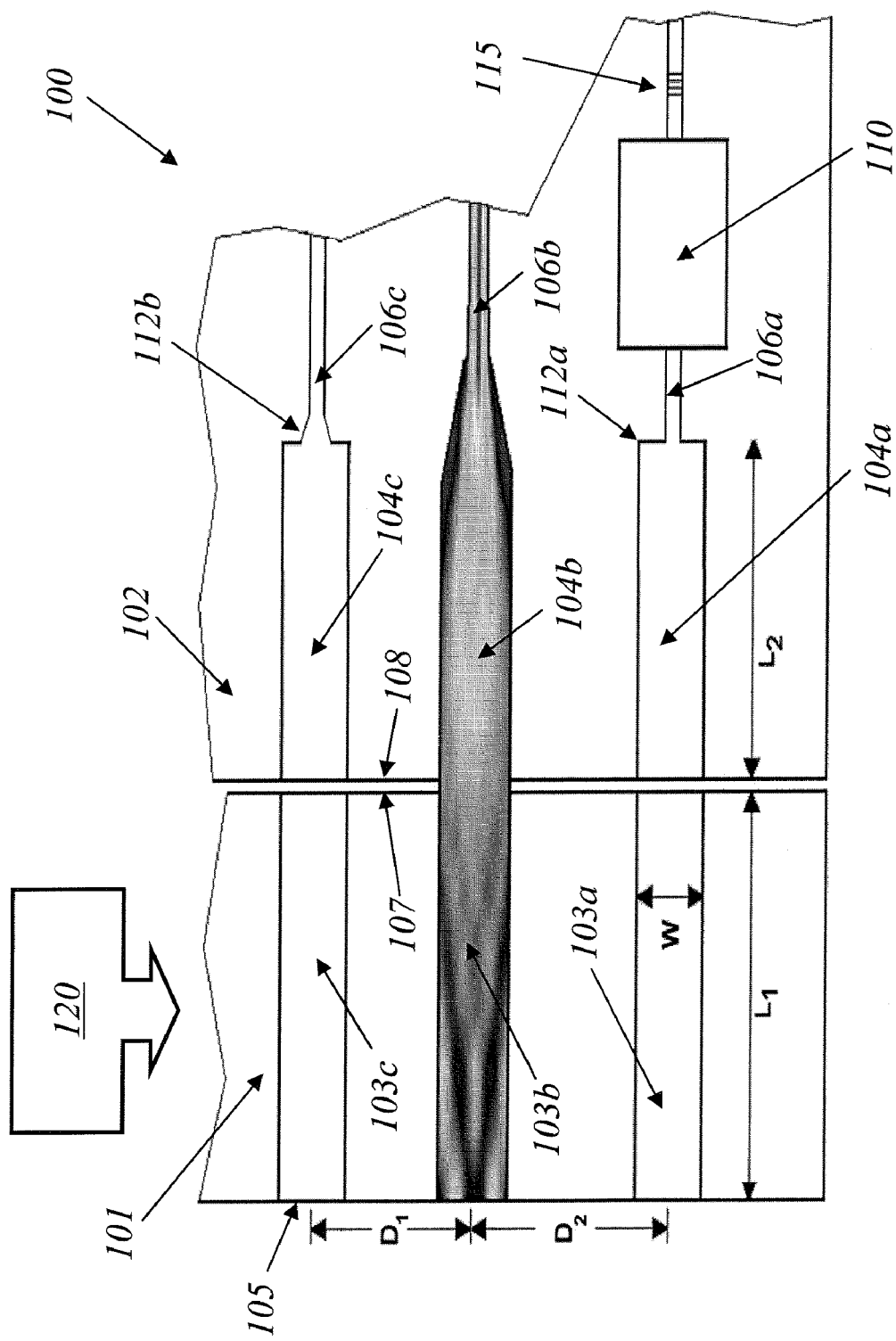
FIG. 1 shows the plan layout of a semiconductor laser diode bar butt-coupled to a silica waveguide (SSMMI) using MMI waveguides.

With reference to FIG. 1, an exemplary embodiment of a high power laser 100 is shown including a laser diode bar 101 butt-coupled to a passive silica chip 102. The laser diode bar 101 includes a plurality of multi-mode semiconductor gain regions 103a to 103c, each with a width W and a length $L_1$, which are optically coupled to multi-mode interference (MMI) regions 104a to 104c, respectively, on the passive silica chip 102 forming compound lasing cavities. Alternatively, the silica chip 102 can be replaced by silica on a silicon substrate, silicon on a silicon substrate and similar material combinations. The laser diode bar 101 can be made of a gallium arsenide or an indium phosphide substrate, with the multi-mode semiconductor gain regions 103a to 103c made of aluminum gallium arsenide, indium gallium arsenide phosphide, indium gallium phosphide, or one of their combinations, depending on the desired emission wavelength and spectral range of the optical gain. The multi-mode semiconductor gain regions 103a to 103c have a back-reflecting facet 105 and a low-reflectivity facet 107 through which light is coupled to the MMI regions 104a to 104c, respectively, which have a corresponding low-reflectivity facet 108. The back-reflecting facet 105 typically has a reflectivity of 30% to 95%, although for some applications values exceeding 95% are preferred. The low-reflectivity facets 107 and 108 typically have reflectivities of less than about 1%, however to avoid the formation of a multiple cavity, values as low as 0.001% may be necessary, which may require suitable angling of the facets. The MMI regions 104a to 104c are further optically coupled to single-mode waveguides 106a to 106c, respectively, which are used as laser outputs. The spacing between the adjacent gain regions, for instance, $D_2$ between 103a and 103b, $D_1$ between 103b and 103c as well as the corresponding MMI regions 104a and 104b, 104b and 104c, can be non-uniform, being adjusted to achieve a predetermined thermal profile across the laser diode bar in a direction transverse to the length of the multi-mode semiconductor gain regions 103a to 103c, e.g. to provide a constant thermal profile or a zero thermal profile. A means for electrically pumping the gain regions 103a to 103c is indicated schematically by 120.

In order to avoid excessive loss, facets 107 and 108 should preferably be antireflection coated, and the gap between them should preferably be under about 100 microns. To further reduce the loss, particularly the loss caused by mode mismatch in the direction normal to the plane of the chips, micro-optics such as a very small cylinder lens could be placed between the facets 107 and 108. Alternatively, one or both of facets 107 and 108 could be fabricated with a curved surface to provide lensing action, similarly to lensed fiber-tip facets which are well-known in the art.

A compound lasing cavity is formed between the back-reflecting facet 105 and a second reflector 115 located in the single-mode waveguide 106a, or within an optical fiber coupled to the single-mode waveguide 106a, or some other suitable location. The second reflector 115 providing optical feedback into the compound cavity can be, for example, a Bragg grating in the waveguide, a fiber Bragg grating, or a simple index discontinuity.

The physical layout shown in FIG. 1 illustrates an example of a MMI cavity laser comprising a multi-mode semiconductor gain region 103a optically coupled to a corresponding multi-mode interference (MMI) region 104a, which is coupled at one end 112a of the MMI region 104a into a single-mode waveguide 106a which includes the second reflector 115. A photonic light circuit (PLC) 110, such as a silica AWG waveguide or a star coupler, may be included between end 112a and second reflector 115 for processing light as it passing through it. The concept can also be applied to an array of devices, e.g. 103a-c and 104a-c.

In the FIG. 1 example, a combined MMI region, which is self-imaging in double pass, is formed from a length $L_1$ of the semiconductor gain region 103a in the laser diode bar 101 plus a length $L_2$ of the MMI region 104a. The self-imaging length for a symmetrically fed MMI cavity with multiple regions of different refractive indices is given by the following formula:

$$\Sigma_i L_i / n_i = m\ W^2 / \lambda_0$$

where $L_i$ is the self-imaging length, $n_i$ is the effective index of refraction, W the waveguide width, $\lambda_0$ the free-space wavelength, and m an integer. For example, a double-pass, symmetrically-fed 100 mm wide waveguide and a 3 mm long laser chip requires that the multimode silica waveguide region be 7.4 mm long, or an integer multiple thereof, in order to provide self imaging.

The operation of the MMI cavity laser may be understood as follows:

Single-spatial-mode feedback is generated at the laser output by a reflector (Bragg grating or index discontinuity such as the output facet of the passive silica chip 102), sending light back through the single-mode waveguide 106a toward the multi-mode semiconductor gain region 103a.

The single-mode waveguide 106a enters the combined MMI region at end 112a with a central single-mode spot. Many lateral modes of the MMI region 104a are excited. The input optical field rapidly spreads to laterally fill the MMI region 104a.

The optical field crosses from the MMI region 104a into the multi-mode semiconductor gain region 103a and undergoes amplification. It is reflected at the high-reflectivity-coated (HR) back-reflecting facet 105 and returns through the multi-mode semiconductor gain region 103a back into the MMI regions 104a respectively.

Completing one round trip through the compound lasing cavity, the optical field reaches its self-imaging length and re-forms into the single spatial mode of the single-mode waveguide 106a.

A small fraction, typically between 0.1% and 20%, of the optical field is reflected again back to re-seed the high power laser 100, while the rest of the optical field is transmitted as the useful output from the single-mode waveguides 106a.

In this way, while there is a relatively small single-mode spot in the single-mode waveguide 106a at the start and end of the round trip through the compound lasing cavity, it gets spread out laterally when it traverses the low-reflectivity facet 108 and the corresponding low-reflectivity facet 107 and propagates inside the multi-mode semiconductor gain region 103a. This enables the full inherent efficiency and optical-power capability of a broad-area laser to be leveraged. It is the seamless extension of the waveguide from the multi-mode semiconductor gain region 103a into the MMI region 104a that enables this invention to function. High optical power density occurs predominantly inside the MMI region 104a. At the interface between the multi-mode semiconductor gain region 103a and the MMI region 104a, the difference between the respective refractive indices is taken care of by the anti-reflection (AR) coatings on the low-reflectivity facets 107 and 108, while the waveguide widths should match, and any gap at the interface should be small enough to limit diffractive loss.

Multiple optical modes inside the compound lasing cavity do give rise to some spatial optical field structure, which is important to understand in order to realize the full advantages of this invention. Optical field structure inside the bulk of the multi-mode semiconductor gain region 103a may generate refractive-index ripples leading to filamentation (so-called hot-spots) or degradation of the imaging performance, so that the optical field structure at the back-reflecting facet 105 may lead to optical damage at the optical power densities of interest.

Figure 2:
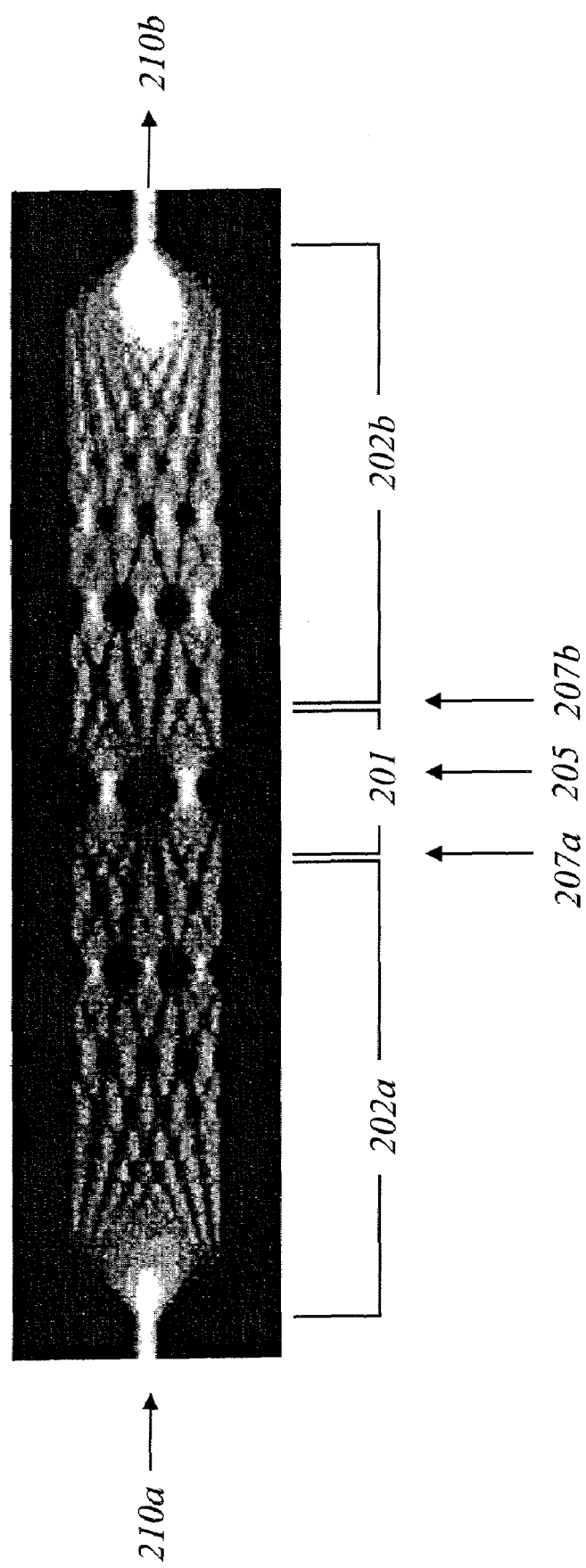
FIG. 2 is a plan view of the optical field intensity within the laser diode/silica MMI waveguide structure, folded out for the purpose of analysis.

FIG. 2 depicts a model of a MMI intensity profile inside the compound lasing cavity for one round trip, obtained by unfolding the intensity profile about the back-reflecting facet 205 (105 in FIG. 1) into a forward trip section (left of facet 205) and return trip section (right of facet 205). At the start of a round trip, light from the single-mode fiber 210a enters the silica MMI region 202a exciting many lateral modes. In this particular design example, the light has reached a 7-fold image plane (third such plane counting from the start) when it reaches interface 207a and enters the semiconductor gain region 201. Upon reaching the back-reflecting facet 205, the light has reached a 2-fold image plane (first such plane counting from the start), where it begins its return trip to interface 207b which by symmetry lies at the fourth 7-fold image plane. Finally, after traversing the silica MMI region 202b in the reverse direction, the light is re-imaged into a single spot at the single-mode fiber 210b. As can be seen, N-fold images of the input optical field are generated at positions of $(p/N)*L$ throughout the MMI, where $p=1, 2, 3, \ldots N-1$. Note that a two-fold image will always occur at the back-reflecting facet 205 (105 in FIG. 1). Fortunately, this is where the optical power density is the lowest in the cavity. For example, in a 10 W laser, one would expect approximately 0.5 W in each of the two images, which will correspond to a very modest power density given the planned image size, assuming an output reflector with 1% reflectivity.

Because FIG. 2 was generated for the case of a relatively narrow 13 micron wide input optical field coupled to a 100 micron wide MMI region in the compound lasing cavity at a wavelength of 865 nm, the spatial structure is clearly resolved up to about 8-fold images, which would likely be a problem for the MMI region of the high power laser 100 in FIG. 1.

A solution as illustrated in FIG. 1 is to add a tapered section 112b to the single-mode waveguide 106c at the point where it couples to the MMI region 104c so that the input fields are less narrow relative to the MMI region 104c width, W, thus reducing the spatial structure that will be resolved inside the MMI.

For example, the geometry shown in FIG. 1 was designed such that the low-reflectivity facet 107 on the multi-mode semiconductor gain region 103a is located approximately at a 7-fold image plane that corresponds to $3/7$ and $4/7$ of the way through the combined MMI and semiconductor gain regions. The single-mode waveguide 106c is tapered, to transition from 10 micron to about 20-25 micron at the output end 112c of MMI region 104c, which still defines a partially abrupt end. Thus, the single-mode input into the MMI region 104c would be roughly $1/4$-$1/5$ of its width, and the 7-fold image of such an input will not be well resolved, resulting in a relatively uniform power distribution at the low-reflectivity facet 107. The output end 112b of the MMI region 104b has a more gradual taper than that of the MMI region 104c, while the output end 112a of the MMI region 104a is rectangular, i.e. with square corners between parallel sides and end faces, defining a fully abrupt transition between the MMI region 104a and the single mode waveguide 106a.

Furthermore, it turns out that between the 2-fold image at the back facet 105 and the 7-fold image at the front 107, all of the images will be higher than 7-fold. So in this example design, there will be no spatial hot spots inside the laser chip other than the two images at the back-reflecting facet 105.

In spite of the suppression of hot spots by design, there is still a risk that spontaneous filamentation will limit the output beam quality. It has been shown that filamentation can be effectively suppressed by the use of quantum dot (QD) gain media due to the decreased gamma factor, as described by Sellin et al., in SPIE volume 5365, 2004. There are a number of laboratories currently engaged in QD research and the technology is becoming fairly mature. If necessary, quantum dot media could be used to alleviate beam quality degradation due to filamentation in the architecture disclosed here.

This embodiment provides a sense of some of the geometrical design considerations. Even higher optical field uniformity in the multi-mode semiconductor gain region 103a could be achieved by slightly shortening it and lengthening the MMI region 104a in silica so that the low-reflectivity facet 107 falls at, for example, the 9-fold image planes at $4/9$ and $5/9$. Other configurations, with other combinations of MMI region widths, lengths, and front facet locations, may also prove useful.

We claim:

1. A high power laser comprising:
   a planar multi-mode optical gain region on a semiconductor chip extending between a first low-reflectivity facet and a back-reflecting facet;
   a means for electrically pumping the multi-mode optical gain region to provide optical gain;

a planar passive multi-mode interference region on an optical chip extending between a second low-reflectivity facet and an output end which is coupled to a single-mode waveguide for providing an output for the laser; and an optical reflector optically coupled with the single-mode waveguide, whereby a laser cavity is defined by the optical reflector and the back-reflecting facet;

wherein the first and second low-reflectivity facets are optically coupled to form a compound multimode interference region between the back-reflecting facet and the output end of the planar passive multi-mode interference region with a length that is a multiple of a self-imaging distance.

2. The high power laser in claim 1, wherein the passive multi-mode interference region has a taper with a narrower end adjoining the single-mode waveguide.

3. The high power laser in claim 1, wherein the passive multi-mode interference region has a rectangular shape.

4. The high power laser in claim 1, wherein the transition between the passive multi-mode interference region and the single-mode waveguide is abrupt.

5. The high power laser in claim 1, further comprising additional planar multi-mode optical gain regions on the semiconductor chip, and additional planar passive multi-mode interference regions on the optical chip.

6. The high power laser in claim 5, wherein the planar multi-mode optical gain regions are spaced apart with a non-uniform spacing in order to provide a predetermined temperature gradient across the semiconductor chip.

7. The high power laser in claim 6, wherein the predetermined temperature gradient is constant.

8. The high power laser in claim 6, wherein the predetermined temperature gradient is zero.

9. The high power laser in claim 1, wherein the optical chip comprises one of silica on a silica substrate, silica on a silicon substrate, and silicon on a silicon substrate.

10. The high power laser in claim 1, wherein the semiconductor chip comprises one or more of gallium arsenide, indium phosphide, indium gallium arsenide phosphide, gallium aluminum arsenide, and gallium indium phosphide.

11. The high power laser in claim 1, wherein the first low-reflectivity facet at the front end of the multi-mode optical gain region is located approximately at an n-fold image plane.

12. The high power laser in claim 11, wherein the n-fold image plane is a 7-fold image plane.

13. The high power laser in claim 11, wherein the n-fold image plane is a 9-fold image plane.

14. The high power laser in claim 5, wherein one or more of the single-mode waveguides is optically coupled to an array waveguide grating.

15. The high power lasers in claim 5, wherein one or more of the single-mode waveguides is optically coupled to a star coupler.

16. The high power laser in claim 1, wherein the single-mode waveguide is flared with increasing width toward the passive multi-mode interference region.

17. The high power laser in claim 1, wherein the first and second low-reflectivity facets have a reflectivity between about 0.1% and 20%.

* * * * *